United States Patent
Pittman

[15] 3,638,044
[45] Jan. 25, 1972

[54] HIGH-VOLTAGE SHORT-DURATION PULSE GENERATOR

[72] Inventor: Cornelius P. Pittman, Garland, Tex.
[73] Assignee: Beckman Instruments, Inc.

[22] Filed: Mar. 4, 1970
[21] Appl. No.: 16,279

[52] U.S. Cl. ....................................307/264, 307/2, 307/5, 307/268, 321/15, 328/53, 328/168
[51] Int. Cl. ....................................................H03k 5/00
[58] Field of Search....................307/2, 5, 22, 26, 227, 246, 307/264, 268; 328/53, 168; 321/15

[56] References Cited

UNITED STATES PATENTS

| | | | |
|---|---|---|---|
| 3,275,853 | 9/1966 | Rothrock | 307/268 X |
| 2,836,718 | 5/1958 | Meier et al. | 321/15 X |

*Primary Examiner*—John Zazworsky
*Attorney*—Fowler, Knobbe & Martens and Robert J. Steinmeyer

[57] ABSTRACT

An electronic circuit for producing high-voltage short-duration pulses including means for superimposing an input pulse on the voltage level of a first power supply and switching means for alternately placing on an output line the voltage of a second power supply and the output of the voltage superimposing means so that the total voltage rise of the output pulse is equal to the sum of the voltage of the input pulse and the total voltage differential between the first power supply and the second power supply. This circuit lends itself to cascading such that each additional stage will add to the output of the previous stage a voltage equal to the voltage differential between the first and second power supply, thus allowing the production of a high-voltage short-duration pulse without the necessity of high-voltage switching components or high-voltage power supplies.

17 Claims, 3 Drawing Figures

INVENTOR.
CORNELIUS P. PITTMAN
BY
FOWLER, KNOBBE
& MARTENS
ATTORNEYS.

INVENTOR.
CORNELIUS P. PITTMAN

BY
FOWLER, KNOBBE & MARTENS
ATTORNEYS.

HIGH-VOLTAGE SHORT-DURATION PULSE GENERATOR

BACKGROUND OF THE INVENTION

This invention applies to electronic circuits for producing a high-voltage short-duration pulse waveform.

In the prior art it has been customary, when amplifying a pulse waveform, to introduce the input pulse into a standard amplification or switching circuit and to bias the switching components or amplifying components within the circuit to produce output voltage amplitudes which were higher than those of the input pulse waveform. In such a system, the switching or amplifying components are required to have a voltage breakdown level in the open circuit condition which is greater than the power supply voltages which produce the desired output amplitude, so that these components can interrupt the output waveform without internal failure. Likewise, if a high amplification factor was required in the prior art devices, multiple stages would be used to amplify the pulse train. However, the voltage levels of the output waveform from the last stage was limited by the voltage levels of the power supplies supplying that last stage, i.e., to produce a 100-volt pulse, it was necessary to have a 100-volt power supply on at least the last stage of the amplification circuit.

The present invention produces high-voltage pulses from low-voltage power supplies through a series of voltage-superimposing operations in which the output amplitude from a previous stage is increased by an amount equal to the voltage of the power supply in the succeeding stage. A significant advantage is that the switching components in each stage need only withstand open circuit voltages equal to the power supply voltage of the stage itself, rather than the output voltage produced by a given stage, since the high-voltage input pulse train from previous stages is applied to the switching components only when they are in their closed circuit condition. The invention therefore allows the amplification of a low-voltage pulse train waveform to produce a high-voltage pulse train waveform without the use of either high-voltage power supplies or high-voltage switching components.

The details of this invention are best understood by reference to the drawings in which.

Figure 1:
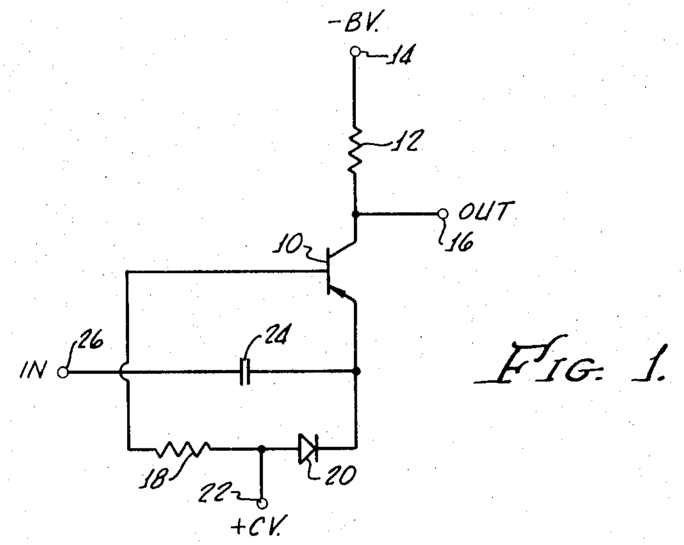
FIG. 1 is a schematic diagram of the basic electronic circuit of this invention.

Referring first to FIG. 1, the basic circuit of the preferred embodiment of this invention is shown to include a switching means or transistor 10, the collector of which is connected through a current-limiting resistor 12 to a power supply at point 14. This power supply is shown to produce an output voltage of −B volts. An output point 16 is connected to the junction between the collector of the transistor 10 and the resistor 12. The base of the transistor 10 is series connected to the emitter of the transistor 10 through a resistor 18 and a diode 20, the junction between these elements being connected to a power source at point 22 which is shown in this example to produce an output voltage of ±C volts. The total voltage differential between −B volts and +C volts, as well as the actual level of these voltages is limited only by the requirement that the voltage differential must be within the voltage breakdown capability of the transistor 10. Furthermore, −B volts may be more positive than ground, or +C volts may be more negative than ground, so long as −B volts is more negative than +C volts. An energy storage device such as a capacitor 24 is used as a superimposing or summing means to couple input signals from an input point 26 to the junction between the diode 20 and the the emitter of the transistor 10. The circuit is adapted to receive at the input point 26 a repetitive pulse signal from a source having some finite output impedance.

Figure 3:
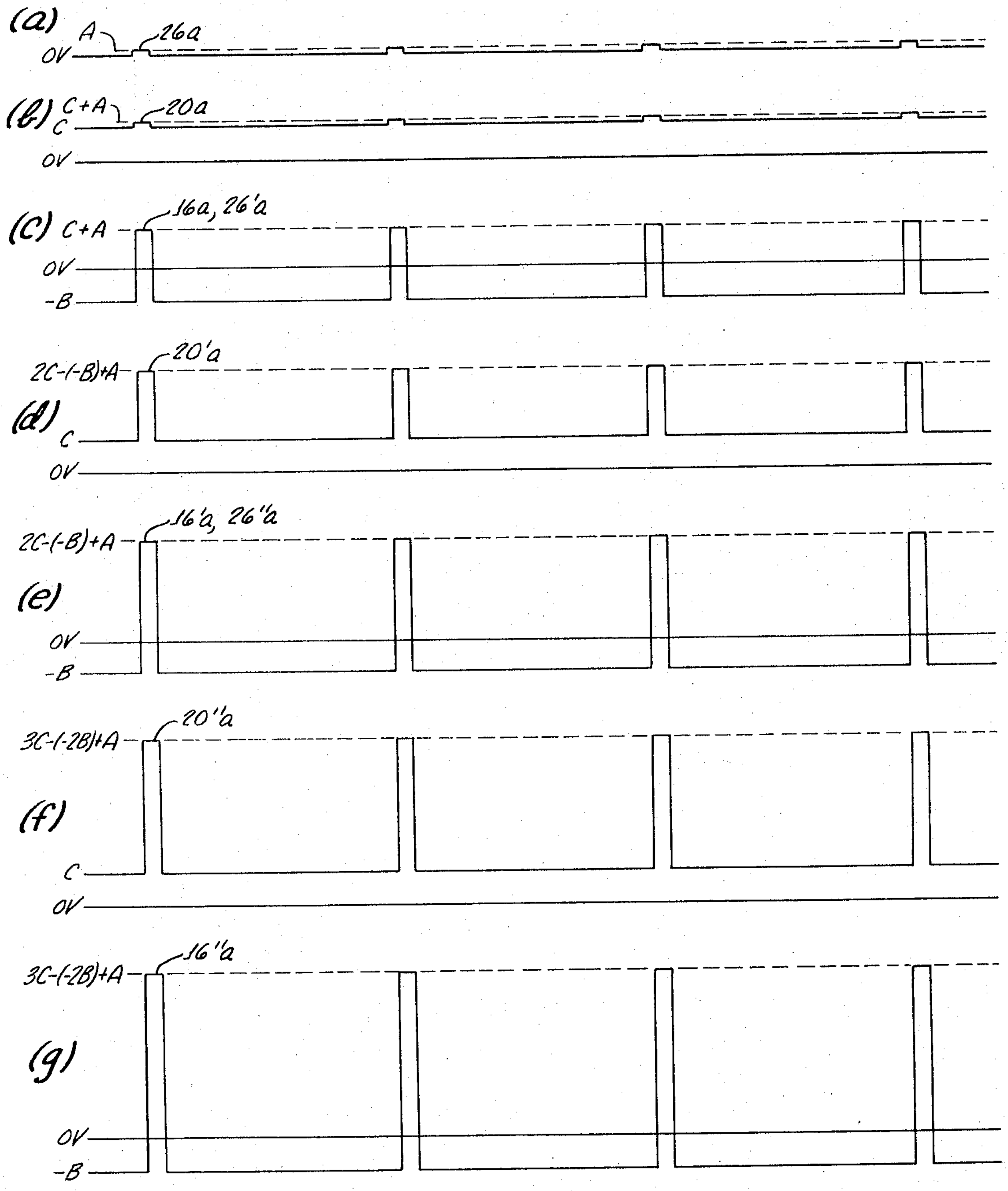
FIG. 3 is a waveform diagram showing voltage levels with time of various portions of the circuits diagrammed in FIGS. 1 and 2.

The operation of the circuit shown in FIG. 1 is best described in reference to FIGS. 1 and 3. Referring first to FIG. 3*a*, the input signal which is applied at point 26 is shown as the waveform 26*a* having a pulse configuration, the amplitude varying between zero volts and +A volts, +A being any desired positive input voltage. When the input point 26 is at zero volts the capacitor 24 is charged to +C volts by the power source at point 22 through the forward-biased diode 20. However, on application of a signal having the level +A volts at point 26, the increased voltage will be reflected through the capacitor 24 such that the voltage at the junction between the diode 20 and the emitter of the transistor 10 will be momentarily increased to the sum of the voltage levels C+A. The AC waveform 26*a* is therefore superimposed upon the voltage +C, without regard to the DC voltage level of the waveform 26*a*. This superimposed voltage waveform which appears at the junction of the diode 20 and the emitter of the transistor 10 is shown in FIG. 3*b* as a transition waveform 20*a*, since it corresponds to the voltage at the cathode of the diode 20.

When the input point 26 is at a quiescent voltage, i.e., between input pulses, and the power supply at point 22 is charging the capacitor 24 through the diode 20, this diode 20 is maintained in a forward-biased condition. The base of the transistor 10 is therefore coupled through the resistor 18 and the forward-biased diode 20 to the emitter of the transistor 10, which coupling makes the potential of the base of the transistor 10 approximately equivalent to the potential of the emitter of the transistor 10, rendering the transistor 10 nonconductive. Since the transistor 10 is nonconductive, the output point 16 is maintained at a voltage level equivalent to −B volts by the power supply at point 14 acting through the resistor 12. However, when the voltage waveform 26*a* rises toward a value of +A volts, the voltage rise is reflected through the capacitor 24, so that the voltage at the cathode of the diode 20 is higher than that at the anode of the diode 20, and this diode 20 becomes reverse-biased making it nonconductive, in turn decoupling the base of the transistor 10 from the emitter of the transistor 10. This decoupling allows the transistor 10 to become conductive and therefore couples the peak of the transition voltage waveform 20*a* to the output point 16, since the resistor 12 limits the current which can be applied by the power supply at point 14. The output point 16 therefore changes in potential from −B volts to +(C+A) volts when the transistor 10 becomes conductive. The signal waveform at the output point 16 is shown as the waveform 16*a* in FIG. 3*c*. When the voltage 26*a* falls toward its quiescent level, a voltage drop is reflected through capacitor 24 to forward-bias diode 20 and again open-circuit the transistor 10, returning the waveform 16*a* to −B volts.

The basic circuit of this invention, as shown in FIG. 1, is therefore capable of producing at its output a pulse, the total excursion of which is equal to the voltage excursion of the waveform at point 26 plus the total potential difference between the power supplies at points 22 and 14. Since, as mentioned previously, the voltage which may be applied at point 26 may have any positive excursion which is desired as well as any quiescent DC voltage level, the voltage amplitudes which will appear at the output point 16 may be substantially higher than the voltage differential between the power supply voltages at points 22 and 14. This capability makes the circuit particularly adaptable to cascade amplification of the input waveform, as will be discussed below in reference to FIG. 2. Likewise, it can be seen that the only voltage which is applied across the transistor 10 when it is in an open-circuit configuration is the voltage differential between the voltage of the power supply 22 and the voltage of the power supply 14. When the input waveform begins to increase above zero volts, the diode 20 becomes reverse-biased and the transistor 10 begins to conduct. Therefore, transistors have open-circuit breakdown voltages below the output voltage level at the point 16 may be used.

Figure 2:
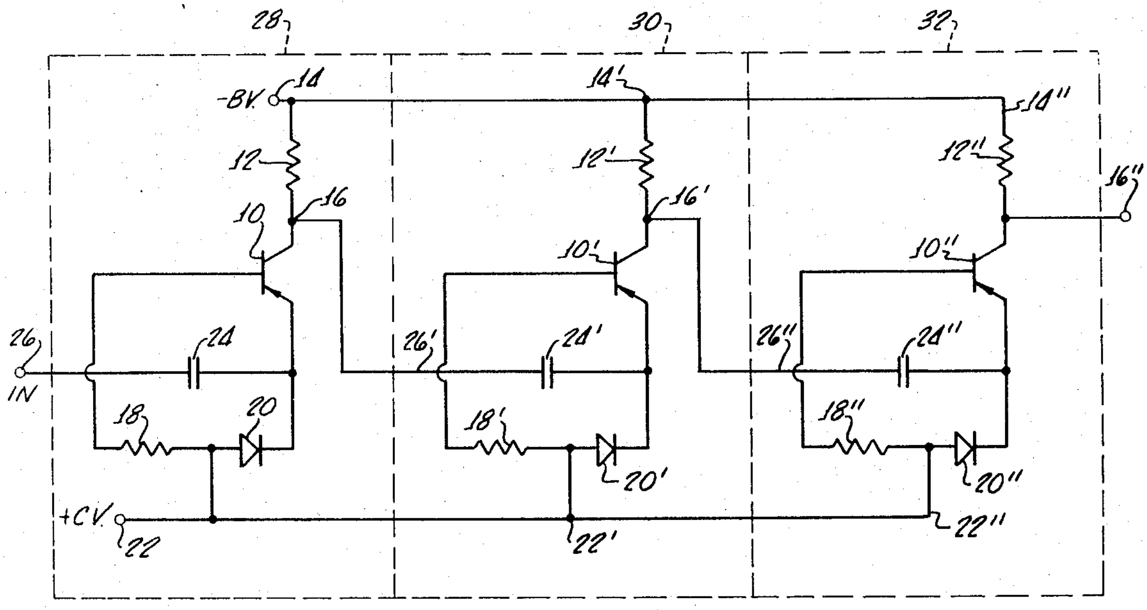
FIG. 2 is a schematic diagram of three circuits such as that shown in FIG. 1 connected in a cascade configuration.

Higher pulse outputs from a given input pulse level are achieved by cascading the basic circuit of FIG. 1, as shown in FIG. 2. The circuitry within the block 28 is a repetition of the circuit of FIG. 1; hence the numbers of the components within the block 28 have been given identical identification numbers with those elements shown in FIG. 1. Likewise, the basic circuit of FIG. 1 has been repeated in each of the blocks 30 and 32, with similar components bearing the identifying numerals with a single prime in the block 30 and a double prime in the block 32. Since the operation of the components within the block 28 is identical to that of those described in reference to FIG. 1, the description of the cascade circuit shown in FIG. 2 begins at the point 16, which is the output of the circuit shown in FIG. 1. This output 16 produces the input waveform to the circuit shown in the block 30, and the waveform 16*a* shown in FIG. 3*c* is therefore additionally labeled 26′*a*. Each of the blocks 30 and 32 function identically with the block 28, except that the level of the input and output signals is different. The input signal to the block 30 is shown in FIG. 3*c* as 26′*a*. Therefore, the signal at the junction between the diode 20′ and the emitter of the transistor 10′, as shown in FIG. 3*d* as the transition waveform 20′*a*, varies between the level +C of the power supply at point 22′ and the level +2C−(−B)+A, i.e., the total excursion of the voltage shown in FIG. 3*c* as 26′*a*, superimposed upon the charge level +C, of the capacitor 24′. The capacitor 24′ is therefore maintained at a level of charge equivalent to the voltage +C until the waveform 26′*a* changes from a voltage level of −B to a voltage level of C+A. This voltage excursion is reflected through the capacitor 24′ and therefore summed with the DC voltage level C to which the capacitor had been charged, and the transition waveform 20′*a* is therefore momentarily maintained at the voltage level 2C−(−B)+A. When this occurs, the transistor 10′ conducts, driving the output point 16′ from its previous level of −B volts to this same level, i.e., 2C−(−B)+A, as shown in FIG. 3*e* as the waveform 16′*a*. This waveform is additionally referenced as 26″*a* since it forms the input waveform to the third block 32. In a similar manner the third block 32 adds to the input waveform 26″*a* the total voltage variance between the power supplies at point 22″ and point 14″, i.e., the sum of C−(−B), and the waveform at the junction between the diode 20″ and the emitter of the transistor 10″ is therefore as shown in FIG. 3*f* as the transition waveform 20″*a*. The output of this cascaded circuit is shown in FIG. 3*g* as 16″*a* and has a voltage excursion from −B volts, i.e., the voltage induced upon the collector of the transistor 10″ by the voltage source at point 14″ when the transistor 10″ is nonconductive, and a voltage level of 3C−(−2B)+A, which is the sum of the input signal 26″*a* and the total potential difference between the power supplies at the points 22″ and 14″.

While three cascaded stages are shown in FIG. 2, additional stages may be cascaded to provide still higher output pulses with each additional cascading circuit adding to the total output excursion the potential difference between its two power supplies. Therefore, a relatively high-voltage pulse may be produced at the end of the cascade series without utilizing high-voltage transistors and without utilizing a high-voltage power supply. In a series of N stages cascaded in the manner shown in FIG. 2, with each of the stages supplied at its particular point 22 with a voltage of C volts and at its point 14 with a voltage of −B volts, and having an input pulse waveform whose amplitude is A volts, the total excursion at the output of the cascade series will be equal to A+N[C−(−B)] volts or, if the total potential difference between the power supplies at points 14 and 22 is equal to D volts, then the total excursion of the output from this cascade series is equal to A+ND volts.

What is claimed is:

1. An electric circuit having an output terminal, said circuit responsive to an input pulse waveform for producing an output pulse waveform of greater amplitude, comprising:

first and second voltage sources;

means for superimposing said input pulse waveform on the voltage level of said first voltage source to produce a transition pulse signal having a quiescent level corresponding to the voltage level of said first voltage source and a peak level corresponding to the sum of the voltage of said first voltage source and the voltage amplitude of said input pulse waveform;

means for inducing on said output terminal of said circuit the voltage of said second voltage source whenever said transition pulse signal is at its quiescent level; and switching means for coupling said output terminal of said circuit to said transition signal whenever said transition pulse signal is at its peak level, so that said output pulse waveform has a peak amplitude equal to the voltage differential between the voltage of said second voltage supply and the peak voltage of said transition pulse signal.

2. An electronic circuit having an output terminal, said circuit responsive to an input pulse waveform for producing an output pulse waveform of greater amplitude, comprising:

first and second voltage sources;

means for superimposing said input pulse waveform on the voltage level of said first voltage source to produce a transition pulse signal having a quiescent level corresponding to the voltage level of said first voltage source and a peak level corresponding to the sum of the voltage of said first voltage source and the voltage amplitude of said input pulse waveform, said superimposing means comprising:

a capacitor having a first and second terminal, said first terminal being connected to said input pulse waveform, means for charging said capacitor to the level of said first voltage source while said input pulse waveform is at its quiescent level, and means for decoupling said charging means from said capacitor when said input pulse waveform is at its peak level, so that the voltage at said second terminal of said capacitor equals the sum of the voltage of said first voltage source and the peak voltage of said input waveform;

means for inducing on said output terminal of said circuit the voltage of said second voltage source whenever said transition pulse signal is at its quiescent level; and switching means for coupling said output terminal of said circuit to said transition signal whenever said transition pulse signal is at its peak level, so that said output pulse waveform has a peak amplitude equal to the voltage differential between the voltage of said second voltage supply and the peak voltage of said transition pulse signal.

3. The electronic circuit defined in claim 2 wherein said decoupling means comprises a diode connected between said first voltage source and said capacitor, said diode becoming reverse-biased when said transition signal voltage is higher than the voltage of said first voltage supply.

4. The electronic circuit defined in claim 1 wherein said inducing means includes a resistor connected between said second voltage source and said output terminal of said circuit.

5. The electronic circuit defined in claim 2 wherein said switching means comprises a transistor, the emitter-collector circuit of which connects said capacitor to said output terminal of said circuit, the conductive state of said transistor responsive to said decoupling means.

6. An electronic circuit having an output terminal, said circuit responsive to an input pulse waveform for producing an output pulse waveform having increased pulse amplitudes, comprising:

an energy storage device;

means for charging said energy storage device to a predetermined level;

means for connecting said energy storage device to said input pulse waveform, so that said input pulse waveform is superimposed on the charge level of said energy storage device;

a power supply; and means responsive to said charging means for alternately inducing upon said output terminal of said circuit the level of said power supply and the charge level of said energy storage device.

7. An electronic circuit having an output terminal, said circuit responsive to an input pulse waveform for producing an output pulse waveform having increased pulse amplitudes, comprising;

an energy storage device;

means for charging said energy storage device to a predetermined level; said charging means comprising:

a second power supply, and a diode, series-connected between said second power supply and said energy storage device, said diode being forward-biased only when said second power supply is charging said energy storage device;

means for connecting said energy storage device to said input pulse waveform, so that said input pulse waveform is superimposed on the charge level of said energy storage device;

a power supply; and means responsive to said charging means for alternately inducing upon said output terminal of said circuit the level of said power supply and the charge level of said energy storage device.

8. The circuit defined in claim 7 wherein said alternately inducing means comprises a transistor, the conduction state of which is dependent upon whether said diode is forward-biased.

9. The circuit defined in claim 8 wherein the base and emitter of said transistor are series-connected through said diode such that said transistor is conductive when said diode is reverse-biased, and nonconductive when said diode is forward-biased.

10. An electronic circuit having an output terminal, said circuit responsive to a low-voltage, short-duration input pulse waveform for producing a high-voltage, short-duration output pulse waveform without the use of high-voltage switching components, comprising:

first and second voltage supplies;

means for superimposing said input pulse waveform on the voltage level of said second voltage supply to produce a transition pulse signal having a quiescent level corresponding to the voltage level of said second voltage source and a peak level corresponding to the sum of the voltage of said second voltage source and voltage amplitude of said input pulse waveform; and switching means for alternately inducing on said output terminal of said circuit the voltage of said first power supply and said transition pulse signal, said switching means being conductive whenever said transition pulse signal is not quiescent.

11. The electronic circuit defined in claim 10 wherein said alternately inducing means induces the voltage of said first power supply on the output when said input pulse waveform is at its quiescent level, and induces said transition pulse signal on the output when said input pulse waveform is at its peak level.

12. An electronic circuit responsive to an input pulse signal for producing an output pulse waveform having increased pulse amplitudes, comprising:

a plurality of subcircuits cascade-connected, each of said subcircuits comprising:

means for generating a voltage level, and means for increasing the amplitude of said input pulse signal by an amount equal to said voltage level.

13. The electronic circuit defined in claim 12 wherein said input pulse signal has a peak amplitude of A volts, said plurality equals N subcircuits, said level of said voltage supply for each subcircuit equals D volts, and said output pulse waveform has an amplitude equal to $A \pm DN$.

14. The electronic circuit defined in claim 12 wherein said voltage supply produces two output voltage levels, and wherein said increasing means adds the difference between said two output voltage levels to the amplitude of said input pulse.

15. A method of amplifying the amplitude of an input pulse waveform, comprising:

superimposing said input waveform upon a first DC voltage level;

producing a second DC voltage level, and alternately connecting a circuit output point to said second DC voltage level and to the signal which results from said superimposing step.

16. The method of amplifying defined in claim 14 wherein said alternately connecting comprises:

monitoring the times at which said input pulse waveform has a peak value;

inducing said signal which results from said superimposing step on said output point when said input waveform has a peak value, and inducing said second DC voltage level on said output point whenever said input waveform has a quiescent value.

17. A method of amplifying the amplitude of an input pulse waveform, comprising:

repeating the subsequence of:

a. superimposing an input waveform upon a first DC voltage level;

b. producing a second DC voltage level, and c. producing an output waveform by alternately connecting a circuit output point to said DC voltage level and to the signal which results from step *a*, in a sequence, such that the output waveform of step *c* of one subsequence is utilized as the input waveform for step *a* of the succeeding subsequence, the sequence including a plurality of such subsequences.

* * * * *